350-311.

4-22-75 XR 3,879,164

United States Patent [19]

Haldopoulos et al.

[11] 3,879,164

[45] Apr. 22, 1975

[54] METHOD OF ISOTHERMALLY HEATING ARTICLES WITH RADIATION

[75] Inventors: Peter Haldopoulos, Naperville; Yemmanur Jayachandra, Bolingbrook, both of Ill.

[73] Assignee: Western Electric Company, Incorporated, New York, N.Y.

[22] Filed: July 11, 1974

[21] Appl. No.: 487,689

Related U.S. Application Data

[63] Continuation of Ser. No. 365,318, May 30, 1973, abandoned.

[52] U.S. Cl. .................... 432/10; 432/12; 219/354; 219/346; 219/85; 34/4; 250/514; 350/311

[51] Int. Cl. ............................................ F26b 3/28

[58] Field of Search .............................. 432/10–12, 432/18, 31, 147, 175; 219/85, 346, 347, 349, 354, 388, 405, 411; 250/510, 514, 505, 340, 341, 342; 350/311, 319; 34/1, 4

[56] References Cited

UNITED STATES PATENTS

| | | | |
|---|---|---|---|
| 1,827,530 | 10/1931 | LeGrand | 34/4 |
| 3,374,531 | 3/1968 | Bruce | 219/347 |
| 3,384,526 | 5/1968 | Abramson | 219/346 |
| 3,628,034 | 12/1971 | Ern | 250/514 |
| 3,836,751 | 9/1974 | Anderson | 219/354 |

*Primary Examiner*—John J. Camby
*Assistant Examiner*—Henry C. Yuen
*Attorney, Agent, or Firm*—R. A. Lloyd

[57] ABSTRACT

To uniformly heat a surface with a source of radiation, the surface having varying thermal heating characteristics in response to irradiation, a filter having radiation absorption characteristics which vary in accordance with the thermal heating characteristics of the surface is positioned between the surface and the source of radiation, such that areas of the filter which have a maximum radiation absorption characteristic overlie areas of the surface which experience maximum thermal heating in response to radiation, and vice versa. Radiation passing through the filter and impinging on the surface is modulated in accordance with the thermal heating characteristics of the surface to uniformly, or isothermally, heat the surface.

5 Claims, 2 Drawing Figures

METHOD OF ISOTHERMALLY HEATING ARTICLES WITH RADIATION

This is a continuation of application Ser. No. 365,318, filed May 30, 1973, now abandoned.

BACKGROUND OF THE INVENTION

1. Field of the Invention

The present invention relates to isothermally heating the surface of an article, and in particular to a method of selective modulating radiation to isothermally heat the surface of the article.

2. Description of the Prior Art

In the fabrication of large scale integrated circuits, problems arise in reliably making mass electrical connections of integrated circuits and terminals to conductors on the surfaces of circuit substrates, such as on the surfaces of circuit packs or multilayer board (MLB) backplanes. As circuit substrates become more crowded with terminals and components in an effort to achieve denser circuitry configurations, electrically connecting the components and terminals to conductors on the substrates, such as with solder, without causing thermal distortion or degradation of the circuits and substrates, is not practical with the present state of the art.

Reflow soldering is a commonly employed technique for electrically connecting integrated circuits and terminals on a surface of a substrate to conductors and other circuits or terminals carried thereon. However, to obtain optimum results in making electrical connections by reflow soldering, it is desirable to uniformly, or isothermally, heat the surface of the article to a temperature which is just sufficient to melt and reflow the solder in order to avoid burning the substrate or components at overheated areas and to avoid cold solder joints at underheated areas. One known technique for attempting to isothermally heat an article is to subject the article to a constant heat, such as in an oven, for an extended period of time. In the case of circuits to be reflow soldered, isothermal heating by this technique is undesirable in that not only are extended soldering times required, but also, with the extended heating times, damage to the electronic components by oxidation and thermal degradation is likely to occur. Another similar technique for attempting to isothermally heat an article contemplates the use of a fluid heat transfer medium, wherein a heated fluid is passed across a surface of the article, or wherein the article is immersed within the fluid. This technique is not, however, reliably effective in isothermally heating the article in that the heat is transferred mainly by conductive and convective processes, and those portions of the article that have high thermal and convective coefficients initially heat to high temperatures before those portions that have low thermal and convective coefficients. Also, the heated fluid comes in contact with the article and, in the case of an electronic circuit, must be thoroughly cleaned from the circuit after the heating operation.

Backplanes of modern electronic switching equipment and computers generally consist of epoxy glass MLB's, and the trend is to employ increasingly denser configurations of terminals and electronic components thereon. For this type of backplane, an infrared reflow soldering operation is an attractive expedient for joining the components and the terminals to conductors on the MLB's. Currently, however, infrared reflow soldering gives poor results in electrically connecting terminals and components to MLB backplanes in that the heating of the surface of the MLB with a source of infrared radiation commonly results in temperature variations of ± 20% across the surface, which is damaging to the MLB and results in thermal distortions, cold solder connections, and burns.

Ideally, it is desirable for an infrared source to isothermally heat the surface of an MLB to effect reflow soldering thereon. However, it is not practical to design an infrared source to yield uniform heating of several different types of MLB's, or even a single type of MLB, for the following reasons: (1) gross differences exist in the fine geometrical areas of MLB's, resulting in differing heat absorption and emission characteristics; (2) the thermal sinking effects of terminals and electrical components on MLB's is widely varying, and (3) there are nonuniform heat losses from the edges of the components and the terminals on the MLB, as well as from the edges of the MLB itself.

SUMMARY OF THE INVENTION

In accordance with the present invention, a filter for use between a source of radiation and a surface of an article to be isothermally heated by the radiation is fabricated by coating a radiation transparent base with a film of photosensitive, radiation absorbing material, and by generating a thermal image of the surface of the article upon exposure to the radiation. The film on the base is then exposed to the thermal image and developed to obtain a representation, in radiation absorbing material, of the thermal image of the surface.

In accordance with the present invention, a surface of an article, areas of which have varying thermal heating characteristics in response to irradiation, is uniformly heated with a source of radiation by irradiating the surface and by filtering the radiation impinging on the surface to control the intensity of the radiation impinging on each area of the surface to heat each area of the surface to the same temperature to uniformly heat the surface.

In one aspect of the invention, the surface has a plurality of diverse items positioned thereon, areas of the surface and items having varying heating characteristics in response to irradiation, and one of the items is fusible upon being subjected to radiation of a predetermined intensity. In this instance, radiation is directed toward the surface and the items and is filtered to pass radiation of the predetermined intensity and to selectively decrease the intensity of the radiant energy impinging on each area of the surface and items to heat each area of the surface and the items to the same temperature to isothermally heat the surface and the items.

In another aspect of the invention, to isothermally heat a surface of an article, areas of which exhibit varying abilities to be heated in response to irradiation, the surface is heated with the source of radiation, a thermal image of the heated surface is generated, and a film including a dichromate, infrared radiation absorbing metal ions, and a reducing agent, carried on an infrared radiation transparent base, is exposed to the thermal image. The exposed film carried on the base is then developed to form a filter which has an image thereon in radiation absorbing metal ions, corresponding to the thermal image, areas of which vary in density directly in proportion with the intensity of the thermal image of corresponding areas of the surface, the varying density of the image of radiation absorbing material being such that when the filter is placed between the source of infrared radiation and the surface of the article in an orientation to pass radiation through areas of the image thereon to impinge on corresponding areas of the surface the radiation impinging on each area of the surface is decreased in intensity by an amount which is sufficient to heat each area of the surface to the same temperature. The filter is then positioned between the source of radiation and the surface of the article in the orientation to heat each area of the surface to the same temperature upon irradiation thereof through the filter, and the surface is irradiated through the filter to isothermally heat the surface.

Other objects, advantages and features of the invention will be apparent upon consideration of the following detailed description when taken in conjunction with the appended drawings.

DETAILED DESCRIPTION

Figure 1:
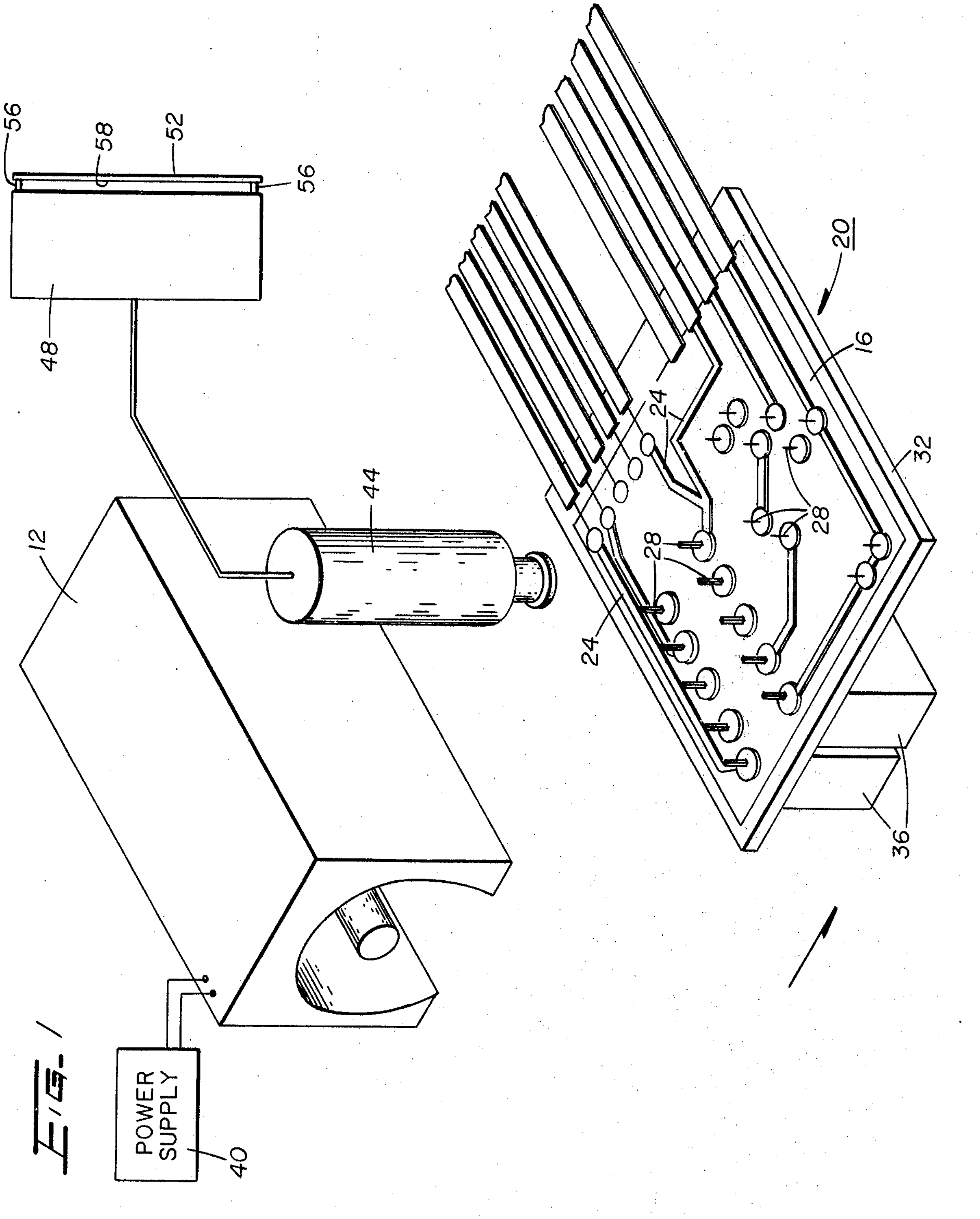
FIG. 1 shows apparatus for fabricating a filter for isothermally heating the surface of a multilayer board in accordance with the teachings of the invention.

Referring to FIG. 1 of the drawings, there is shown apparatus for fabricating a filter for use between a source of infrared (IR) radiation 12 and a surface 16 of an article 20 to selectively modulate the radiation from the source 12 to isothermally heat the surface 16. In the present invention the article 20 is a mutlilayer board (MLB) having fusible solder patterns on the surface 16 which are to be reflow soldered, and includes thereon a plurality of conductive paths 24 and terminals 28 which extend through an epoxy glass substrate 32 from components 36 mounted on the opposite side of the substrate, as well as a pattern of solder carried on the conductors 24 and around the terminals 28, all of which items, as a result of different thermal absorptivities, reflectivities and heat sinking effects, cause the surface 16 of the MLB 20 to experience a variable heating pattern in response to direct IR irradiation thereof. While the invention will be described with respect to the isothermal heating of the surface of an MLB, it is to be appreciated that the principles of the invention may just as readily be applied where the surface of any type of article, or the surface of each of a plurality of articles, is to be isothermally heated.

As will be apparent from the following description of the invention, a filter fabricated for use between the source of radiation 12 and the surface 16 of the MLB 20 may only be employed to isothermally heat the surface of that MLB, or the surface of other MLB's having substantially identical geometric configurations, and that to heat the surface of MLB's having different geometric configurations requires the fabrication of other filters since the geometric configuration of the MLB determines, to a large extent, the thermal heating pattern exhibited by that surface of the MLB upon irradiation thereof. Therefore, in the description of the fabrication of the filter, and in the description of its subsequent use to isothermally heat the surface of the MLB, it is assumed that the geometric configuration of the MLB employed in fabricating the filter, and of the MLB isothermally heated through the use of the filter, are substantially identical.

The filter for use between the IR radiation source 12 and the surface 16 of the MLB 20 to isothermally heat the surface 16 is fabricated by generating a visible thermal image, or thermogram, of the heating experienced by the surface 16 upon direct exposure to radiation from the source 12, and by then photopatterning, with the visible thermal image, an IR radiation absorbing material onto an IR radiation transparent carrier. The photopatterned IR radiation absorbing material, after developing, has a variable density pattern which varies in accordance with the thermal heating pattern of the heated surface 16, and absorbs IR radiation in accordance with its density.

In particular, the filter is fabricated by assembling a representative MLB 20 with all of the solder, components 36 and other hardware thereon, and by then linearly conveying the MLB 20 on any conventional conveyor (not shown) beneath the source 12 of IR radiation to irradiate and heat the surface 16 thereof and the hardware thereon to generate a variable heating pattern thereon in accordance with the particular geometric configuration of the MLB. Preferably, the IR radiation source 12 is excited to a radiation output, by a power supply 40, which is less than sufficient to reflow the solder on the surface 16 of the MLB to prevent burning and thermal degradation of the MLB. After being conveyed beneath and heated by the source 12 of radiation, and while the surface 16 and the hardware is still warm and exhibiting the thermal heat pattern generated thereon by irradiation thereof, the MLB 20 is stopped beneath and viewed by an IR radiation sensitive camera 44, such as a "Thermoimager" Model 201 camera sold by the Dynarad Corporation of Norwood, Mass. The IR radiation sensitive camera 44 scans the surface 16 of the MLB in real time and provides a thermal image, or thermogram, in actinic light on the cathode ray tube, or screen, of a TV monitor 48, which thermal image is a representation of the heating pattern on the surface 16 of the MLB and of the hardware thereon, and which varies in light intensity in accordance with the heating experienced by the surface 16 and the hardware. An IR radiation transparent carrier 52, having IR radiation absorbing material to be photopatterned thereon, is then secured before the screen of the monitor 48 by any suitable means, such as by a mounting post 56 at each corner of the screen, for exposure to the thermal image thereon. The exposed material is then developed to form on the carrier 52 a variable density layer of radiation absorbing material which absorbs radiation in accordance with its density, and which has a density pattern which varies in accordance with the light intensity of the pattern of the thermogram on the screen of the monitor 48, which in turn, of course, varies in accordance with the variable heating pattern experienced by the surface 16, and the hardware thereon, of the MLB 20.

More specifically, the IR radiation absorbing material to be photopatterned on the filter is initially prepared by mixing a photodiffusion and staining compound of ions of a radiation absorbing material such as gold, silver or copper salts, with siliceous clay and reducing agents which are required for a subsequent ion diffusion into the borosilicate glass carrier 52. In the present invention, the photodiffusion and staining compound has the following composition:

| | |
|---|---|
| copper sulfate | 2.0 grams |
| silver nitrate | 1.5 grams |
| stannus nitrate | 0.1 grams |
| aluminum nitrate | 0.1 grams |
| potassium silicate | 1.0 grams |

The photodiffusion and staining compound is then suspended in a polyvinyl alcohol medium, which acts as a photopolymer, to form a slurry mixture having the following concentration:

| | |
|---|---|
| photodiffusion and staining compound | 5 grams |
| 10% polyvinyl alcohol and water | 100 cc |

To the slurry may be added, although not necessary in the final formulation, two drops of octyl alcohol, which acts as a foam inhibitor during mixing of the slurry, and 10 cc of isopropyl alcohol, which increases the drying rate of the slurry when the slurry is later applied as a film to one side of the borosilicate glass carrier 52.

After mixing the slurry, the final formulation thereof is then obtained by adding 0.2 cc of ammonium dichromate thereto, which acts as a photocatalyst, to obtain a high contrast photosensitive slurry formulation. The slurry formulation is then applied as a thin uniform film, such as by spraying, to one side 58 of the borosilicate glass carrier 52, dried, and exposed to the actinic light thermal image on the screen of the TV monitor 48. Preferably, the siliceous clays and reducing agents are transparent to permit maximum exposure of the photosensitive film throughout its thickness to the actinic light thermal image.

After exposure to the actinic light thermal image on the screen of the monitor 48, the film is developed with deionized water for 2 to 3 minutes to form a slurry image of IR radiation absorbing material, on the carrier 52, which is representative of the thermal image on the screen of the TV monitor 48. The carrier 52 with the developed thermal image thereon is then heated at 1,000° to 1,500°F for approximately 3 hours to diffuse the IR radiation absorbing metal ions into the borosilicate glass in a pattern corresponding to, and having a density in proportion with the density of, the developed thermal image. The filter is then slowly cooled, washed with ionized water which removes therefrom the remaining photoresist which has been decomposed to an ashlike residue during the heating process, and dried. The resulting filter contains a variable density pattern of the radiation absorbing ions diffused into the borosilicate glass carrier, which ions absorb radiation in accordance with their density.

As fabricated, the filter contains more IR radiation absorbing metal ions in areas corresponding to the brighter areas of the thermal image on the TV monitor 48, and less IR radiation absorbing metal ions in areas corresponding to the darker areas of the thermal image on the screen of the TV monitor 48, since the greater the intensity of the actinic light to which the photoresist pattern is exposed the greater the concentration of ions which will remain after developing. Also, the greater the concentration of ions in the carrier 52, the less is its IR radiation transmission. The resulting filter is, therefore, comprised of the IR radiation transparent carrier 52 having the variable density pattern of IR radiation absorbing material diffused therewithin, which pattern is a representation of the thermal image on the screen of the monitor 48 and absorbs radiation in accordance with its density, and which has a density which varies directly in accordance with, and is representative of, the intensity of the thermal image on the screen of the monitor 48. The pattern on the filter is, therefore, representative of, and varies directly in accordance with, the thermal heating pattern on the surface 16 of the MLB 20 upon direct IR irradiation thereof. That is, the density of the pattern of IR radiation absorbing material on the filter at any point is in direct proportion to the thermal heating experienced by the surface 16 at the same corresponding point.

Figure 2:
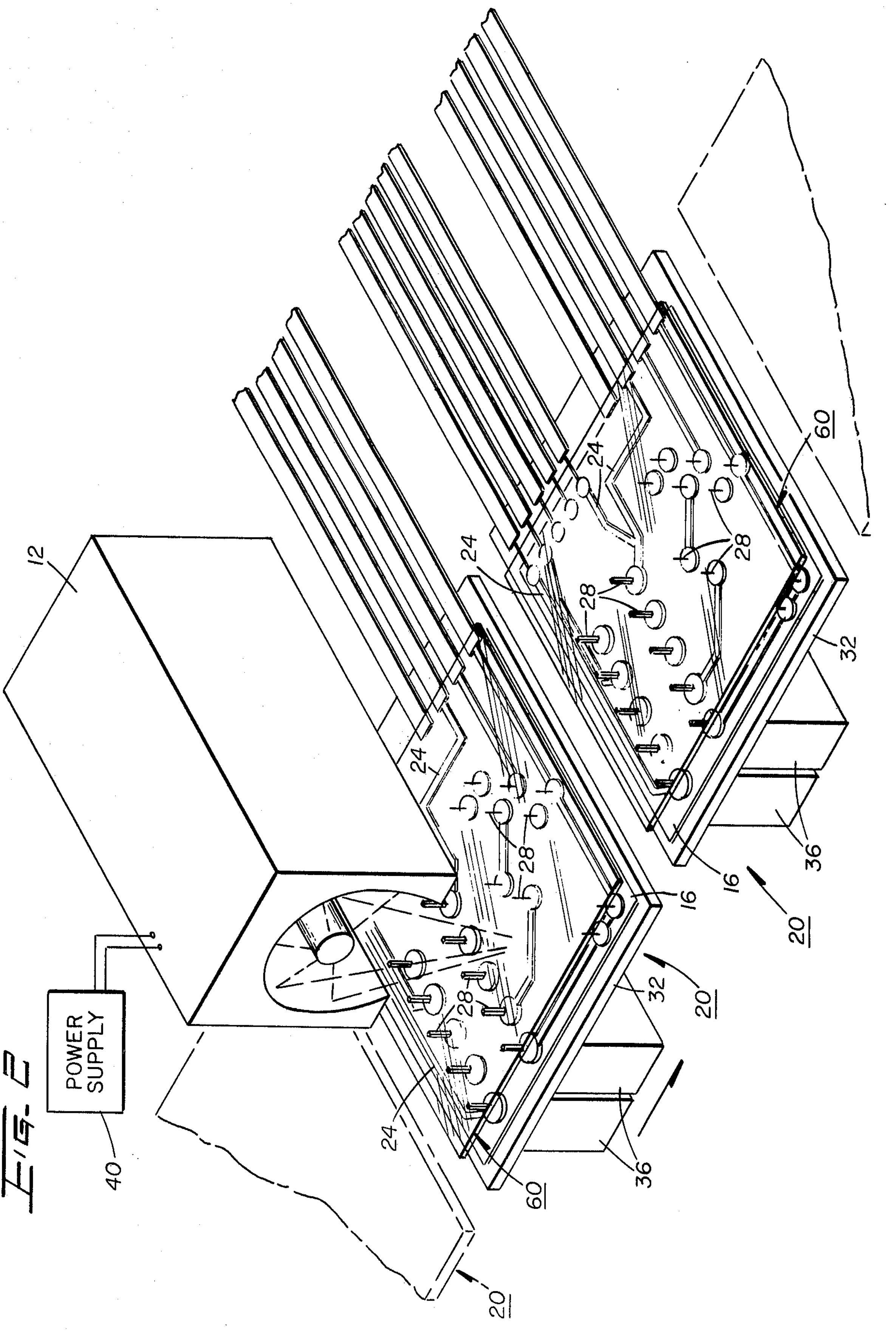
FIG. 2 shows filters, fabricated with the apparatus of FIG. 1, each positioned between a source of infrared radiation and the surface of a multilayer board to obtain isothermal heating of the surface of the multilayer board.

In use, as shown in FIG. 2, one or more MLB's 20, each having a filter 60 positioned thereabove, are sequentially linearly conveyed beneath the source 12 of IR radiation. Each filter 60 has been fabricated as previously described, and is positioned over the surface 16 of an associated MLB, such as by being rested on the upright standing terminals 28 thereof, so that the variable density pattern of IR absorbing material thereon is in registry with, and lies directly above, the corresponding thermal heating pattern which would be experienced by the surface 16, and the hardware thereon of the MLB 20 upon irradiation thereof in the absence of the filter. At this time, the power supply 40 energizes the IR radiation source 12 to a level which is sufficient, with a filter 60 positioned between the source 12 and a surface 16 of an MLB 20, to reflow the solder on the surface 16 with the radiation which passes through the filter 60 and impinges on the surface 16. With the filter 60 placed between the source of IR radiation 12 and the surface 16 of the MLB 20, the intensity of the radiation passing through the filter 60 and impinging on the surface 16 is modulated, in accordance with the variable density pattern of the IR radiation absorbing ions on the filter, to isothermally heat the surface 16 and the hardware thereon. That is, the radiation passing through areas of the filter 60 for impinging on corresponding areas of the surface 16 and the hardware thereon is selectively modulated to decrease the intensity of the radiation impinging on each area of the surface and hardware by an amount determined by the ability of the area to be heated in response to irradiation to control the intensity of the radiation impinging on each area of the surface and hardware to heat each area to the same temperature to uniformly heat the surface 16 and the hardware to reflow the solder.

Preferably, the pattern of IR absorbing material on the filter should have a size scale between 0.8 and 0.95 to 1 of the corresponding thermal heating pattern of the surface 16 of the MLB 20. This slight minification of the pattern on the filter 60 of the thermal image on the surface 16 provides compensation, when the filter is employed to isothermally heat the surface 16, for the heat spreads on the surface 16 due to lateral thermal conductivities across the surface 16. In practice, if the carrier 52 having the photosensitive film thereon is contact exposed to the thermal image on the screen of the monitor 48 to obtain a 1 to 1 size relationship therebetween, the reduction in scale of the image may be readily achieved by simply reducing the size of the image as displayed on the screen of the monitor 48.

While one embodiment of the invention has been described in detail, it is understood that various other modifications and embodiments may be devised by one skilled in the art without departing from the spirit and scope of the invention.

What is claimed is:

1. In a method of isothermally heating a surface of an article, areas of the surface having varying heating characteristics in response to irradiation:

projecting a beam of radiant energy across the surface of the article;

imparting relative movement between the radiant heat beam and the article to scan and heat the surface of the article with the beam, and filtering the radiation in the beam scanned across the surface of the article to selectively decrease the intensity of the radiant energy impinging on areas of the surface to heat each area of the surface to the same temperature to isothermally heat the surface of the article.

2. In a method of uniformly heating a surface of an article with a source of radiation, areas of the surface having varying thermal heating characteristics in response to irradiation:

irradiating the surface, and filtering the radiation impinging on the surface to selectively decrease the intensity of the radiation impinging on areas of the surface to heat each area of the surface to the same temperature to uniformly heat the surface.

3. In a method of isothermally heating a surface having a plurality of diverse items positioned thereon, wherein areas of the surface and the items have varying heating characteristics in response to irradiation:

directing radiant energy toward the surface and items, and filtering the radiant energy impinging on the surface and items to selectively decrease the intensity of the radiant energy impinging on areas of the surface and items to heat each area of the surface and the items to the same temperature to isothermally heat the surface and the items.

4. In a method as set forth in claim 3, wherein one of the diverse items is fusible upon being subjected to radiation of a predetermined intensity, and the filtering step passes radiation of the predetermined intensity.

5. A method of isothermally heating a surface that has diverse heating characteristics when subjected to infrared radiation, which comprises:

subjecting the surface to infrared radiation;

filtering the infrared radiation to vary the intensity of the radiation impinging on the surface in direct relationship to the heat absorbing characteristics of the surface, the filtering being such that the maximum intensity of radiation is impinged on those portions of the surface having the least ability to be heated in response to irradiation, the minimum intensity of radiation is impinged on those portions of the surface having the greatest ability to be heated in response to irradiation, and the intensity of the radiation impinging on all other portions of the surface is in inverse proportion to the ability of those areas to be heated in response to irradiation to heat each portion of the surface to the same temperature to isothermally heat the surface.

* * * * *